United States Patent
Burke et al.

(10) Patent No.: US 8,594,147 B1
(45) Date of Patent: Nov. 26, 2013

(54) MONOLITHIC DIODE PUMPED SOLID-STATE LASER FOR HIGH SHOCK ENVIRONMENTS

(75) Inventors: Gregory Burke, Hanover, NH (US); Luke Helsel, Rockaway, NJ (US); Thomas DeVoe, Lake Hopatcong, NJ (US); Jacqueline Quinn Baeder, Dover, NJ (US); David Bound, Denville, NJ (US)

(73) Assignee: The United States of America as Represented by the Secretary of the Army, Washington, DC (US)

(*) Notice: Subject to any disclaimer, the term of this patent is extended or adjusted under 35 U.S.C. 154(b) by 166 days.

(21) Appl. No.: 13/216,611

(22) Filed: Aug. 24, 2011

(51) Int. Cl.
*H01S 3/091* (2006.01)
(52) U.S. Cl.
USPC .............. 372/75; 372/34; 372/35; 372/36; 372/72
(58) Field of Classification Search
USPC ..................... 372/34, 35, 36, 72, 75
See application file for complete search history.

(56) References Cited

U.S. PATENT DOCUMENTS

| | | | | |
|---|---|---|---|---|
| 3,683,296 A * | 8/1972 | Scalise | | 372/75 |
| 3,711,789 A * | 1/1973 | Dierschke | | 372/75 |
| 5,140,607 A * | 8/1992 | Paiva | | 372/70 |
| 6,330,259 B1 * | 12/2001 | Dahm | | 372/35 |
| 6,400,740 B1 * | 6/2002 | Karpinski | | 372/36 |
| 8,218,597 B1 * | 7/2012 | Fay et al. | | 372/70 |
| 2003/0214986 A1 * | 11/2003 | Kouta et al. | | 372/39 |
| 2010/0195679 A1 * | 8/2010 | Kroupa et al. | | 372/10 |

OTHER PUBLICATIONS

Hardy et al., "High-efficiency side diode pumped breech mount laser ignition" 2007, Optical Technologies for Arming, Safing, Fuzing, and Firing III, Proc. of SPIE, vol. 6662, 66620F.*

* cited by examiner

*Primary Examiner* — Jessica Stultz
*Assistant Examiner* — Joshua King
(74) *Attorney, Agent, or Firm* — Michael C. Sachs

(57) ABSTRACT

A diode pumped solid-state laser for high shock, high vibration environments such as those found in laser ignition systems for artillery systems which internally integrate into the breech of an artillery system such as a 155 mm howitzer. The diode pumped solid-state laser employs a unique gain medium mounting which permits its use in such high shock/high vibration environments. Contributing further to robustness is a monolithic design based on diode arrays mounted in a linear configuration along with an advanced polycrystalline gain medium laser rod. Advantageously, and in sharp contrast to laser ignition systems incorporating flash lamps, the diode pumped solid-state laser of the present invention permits a seamless integration into a howitzer artillery weapons system without other complex mounting provisions or shock isolation system(s). Of further advantage, the diode pumped solid-state laser of the present invention facilitates integration into existing breech hardware with relatively only minor modification. This simplifies design of allied such breech and laser assemblies, their integration requirements, and further results in a reduced total system weight.

4 Claims, 4 Drawing Sheets

MONOLITHIC DIODE PUMPED SOLID-STATE LASER FOR HIGH SHOCK ENVIRONMENTS

U.S. GOVERNMENT INTEREST

The inventions described herein may be made, used, or licensed by or for the U.S. Government for U.S. Government purposes.

BACKGROUND OF INVENTION

This invention relates generally to ruggedizing a solid-state laser so it can be used and built into the design of a high shock, high vibration environment device, such as found in the breech of an artillery weapon.

Conventional artillery systems, in particular 155 mm howitzer artillery weapons systems, use energetic primers in their ignition train which may use a laser ignition system wherein the propellant charge is ignited by a laser means using an emitter positioned in the breech carrier of the artillery device. However as might be appreciated, positioning a laser ignition system in the breech of such an artillery device presents numerous mechanical challenges in making the laser ignition system sufficiently robust to endure the extreme vibrations and shock produced in firing the artillery device. Further challenges include extreme environmental conditions such as heat, cold, wet or dry conditions also experienced with artillery systems as well as to withstand unfavorable electrostatic and electromagnetic environments.

FIELD OF THE INVENTION

This invention relates generally to the field of solid-state lasers and in particular is directed to a ruggedized solid-state laser for high shock and high vibration environments such as those found in artillery weapons.

BRIEF SUMMARY OF THE INVENTION

The above problems are solved and an advance is made in the art according to the principles of the present invention directed to a diode pumped solid-state laser employing a unique gain medium mounting which permits its use in high shock/high vibration environments such as those found in the breech of an artillery system. Contributing further to robustness is a monolithic design based on diode arrays mounted in a linear configuration along with an advanced polycrystalline gain medium laser rod. Advantageously, and in sharp contrast to prototype prior-art laser ignition systems incorporating flash lamps, the diode pumped solid-state laser of the present invention permits this seamless integration into a howitzer artillery weapons system without complex mounting provisions or shock isolation systems. Of further advantage the diode pumped solid-state laser of the present invention facilitates integration into existing breech hardware with only minor modification to existing breech hardware thereby simplifying the breech and laser assemblies and integration requirements while reducing total system weight.

OBJECTS OF THE INVENTION

Accordingly, it is an object of the present invention to provide means for integrating a solid state laser ignition device into the breech mechanism of a large caliber Howitzer artillery weapon.

Another object of the present invention is to provide a solid state laser ignition device which can function dependably despite work environments of extreme shock, extreme vibration, extreme temperature ranges, electrostatic and electromagnetic environments, as well as extreme damp and dry environments.

It is a further object of the present invention to provide a solid state laser ignition device which has a monolithic design based on diode arrays mounted in a linear configuration along with an advanced polycrystalline gain medium laser rod.

These and other objects, features and advantages of the invention will become more apparent in view of the within detailed descriptions of the invention, the claims, and in light of the following drawings wherein reference numerals may be reused where appropriate to indicate a correspondence between the referenced items. It should be understood that the sizes and shapes of the different components in the figures may not be in exact proportion and are shown here for visual clarity and for purposes of explanation. It is also to be understood that the specific embodiments of the present invention that have been described herein are merely illustrative of certain applications of the principles of the present invention. It should further be understood that the geometry, compositions, values, and dimensions of the components described herein can be modified within the scope of the invention and are not generally intended to be exclusive. Numerous other modifications can be made when implementing the invention for a particular environment, without departing from the spirit and scope of the invention.

BRIEF DESCRIPTION OF THE DRAWINGS

Further features and advantages of the present invention may be understood from the drawings in which.

DETAILED DESCRIPTION OF THE INVENTION

Figure 1A:
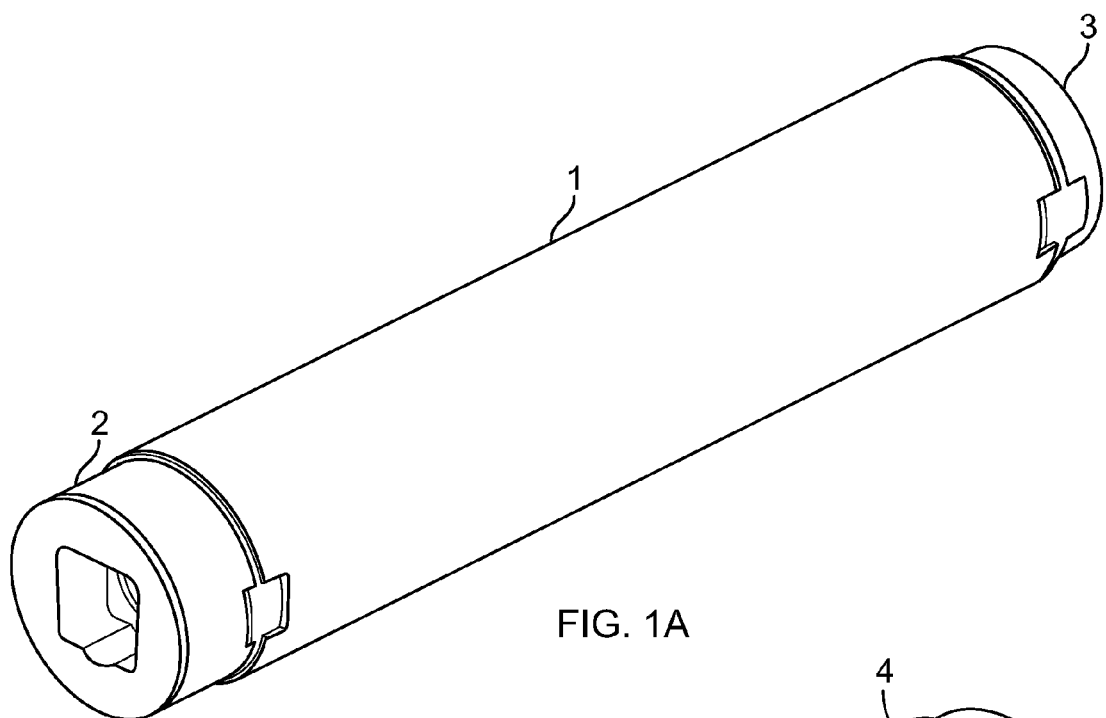
FIG. 1A is an external perspective view looking at the front end of a diode pumped solid state laser assembly according to the present invention.
Figure 1B:
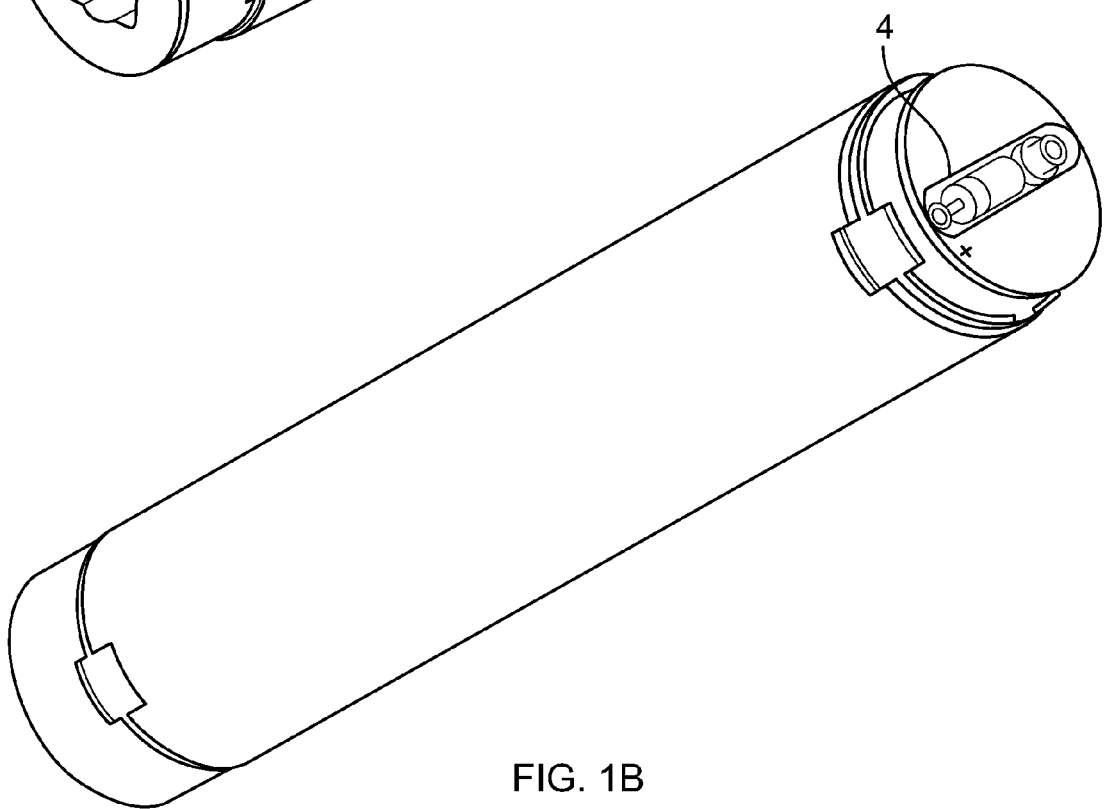
FIG. 1B is an external perspective view looking at the rear end of a diode pumped solid state laser assembly according to the present invention.

In accordance with one preferred embodiment of this invention reference is made to FIG. 1A-FIG. 1B, which show an external view of a diode pumped solid-state laser according to the present invention. More particularly, one may observe laser body 1, generally a hollow tube structure, connecting two end caps 2 and 3 that are positioned at opposite ends of the body tube 1.

The front end cap 2 is cut to accept a standard 3/8" socket drive to allow easy assembly into the spindle. This is necessary as the laser tailstock is keyed to allow installation in only one orientation.

Shown further in FIG. 1A and FIG. 1B are electrical pins 4 and output aperture which are part of input end cap 3 and output end cap 2 respectively.

By way of additional background, those skilled in the laser arts will quickly recall that lasers generally comprise three essential components: an active gain medium, a pumping mechanism, and a cavity.

Figure 2:
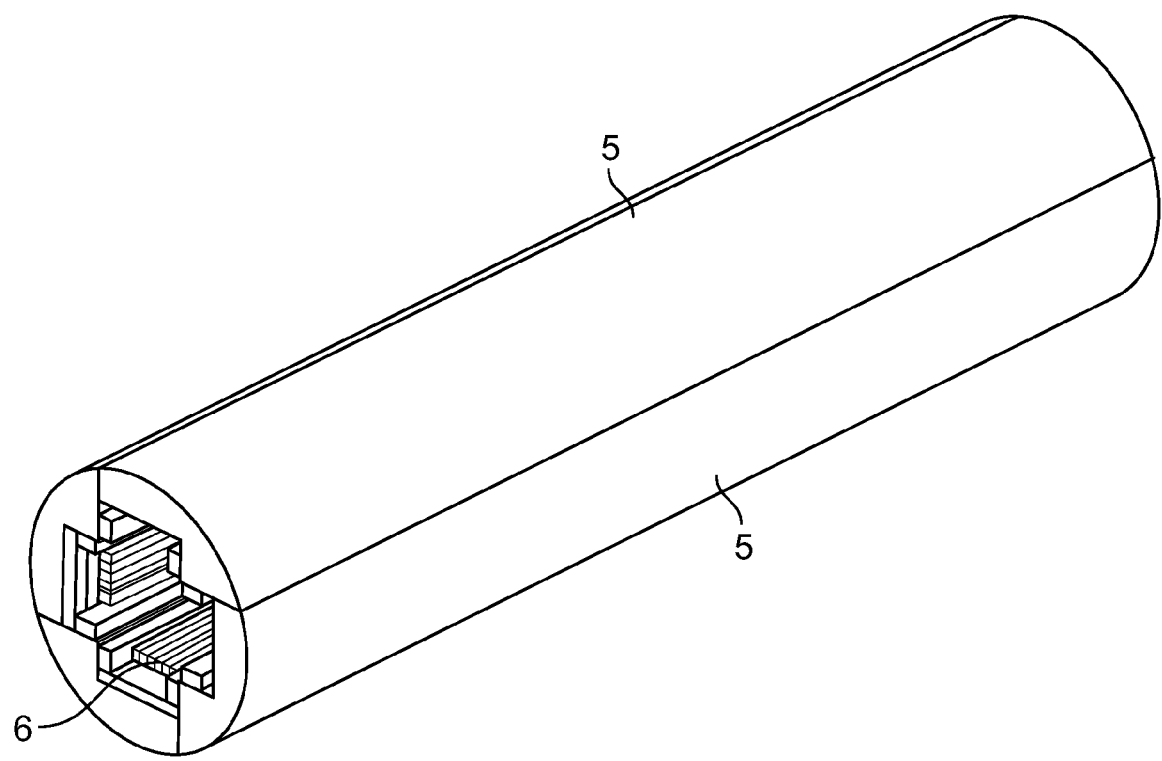
FIG. 2 is a perspective view of a diode pumped solid state laser assembly according to the present invention.

Turning now to FIG. 2, there is shown a sectional view of the diode pumped solid-state laser of FIG. 1A and FIG. 1B with the body tube 1 removed. In this sectional view of FIG. 2 it may be seen that the laser assembly comprises of four segments 5 interposed between the input and output end caps 2 and 3, respectively (another possibility, a two segment type, is not shown here).

In particular, each segment 5 contains a stack of pump diodes 6. Each segment is positioned to hold and support the laser rod or gain medium over its full length.

The stacked diodes 6 form a pumping mechanism for the diode pumped solid-state laser of the instant application. Specifically shown in FIG. 2 is a four segment design, where each of the linear segments 5 has an array of light emitting pump diode bars 6. These diodes are positioned around an inner perimeter of the gain medium. The diodes can be arranged longitudinal (shown) or (not shown) laterally along the gain medium. As mentioned, here the diode bars 6 are stacked along a gain medium rod, which in a preferred embodiment is Yttrium Aluminum Garnet (YAG) or another suitable material. When configured in this manner, the gain medium rod can be fully illuminated over its entire length with no dark or shadowed regions.

Electrical connections (not shown) are made between each pump diode stack through either direct solder traces located on each linear segment or through soldered buss bars. Accordingly, electrical power which is applied to electrical contacts 4 (FIG. 1A) will energize each of the diode segments comprising the stack. As a result, when power is applied to the electrical contacts 4, the diode segments are energized and thereby will pump the active gain medium rod sufficiently to produce a laser action and laser output at an output aperture in end cap 2.

Figure 3A:
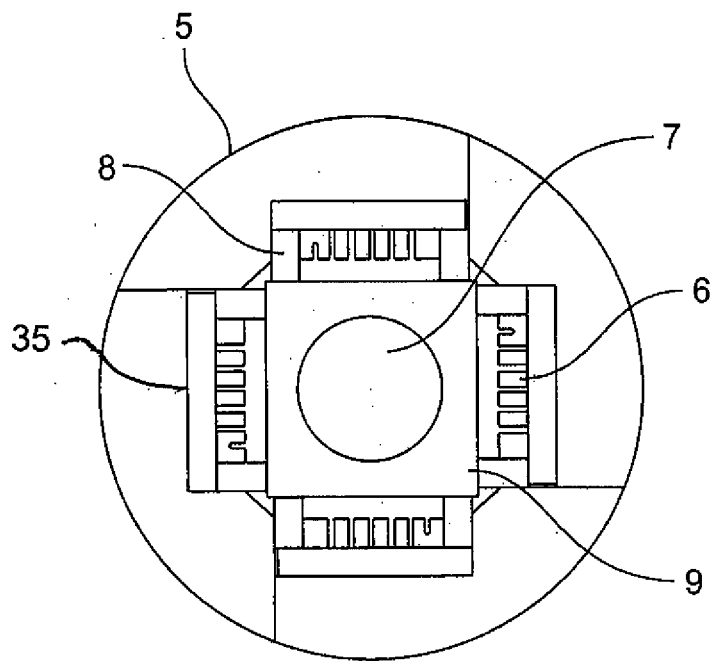
FIG. 3A is a cross sectional view of the front end of a connected diode pumped solid state laser assembly according to the present invention located within the spindle environment.
Figure 3B:
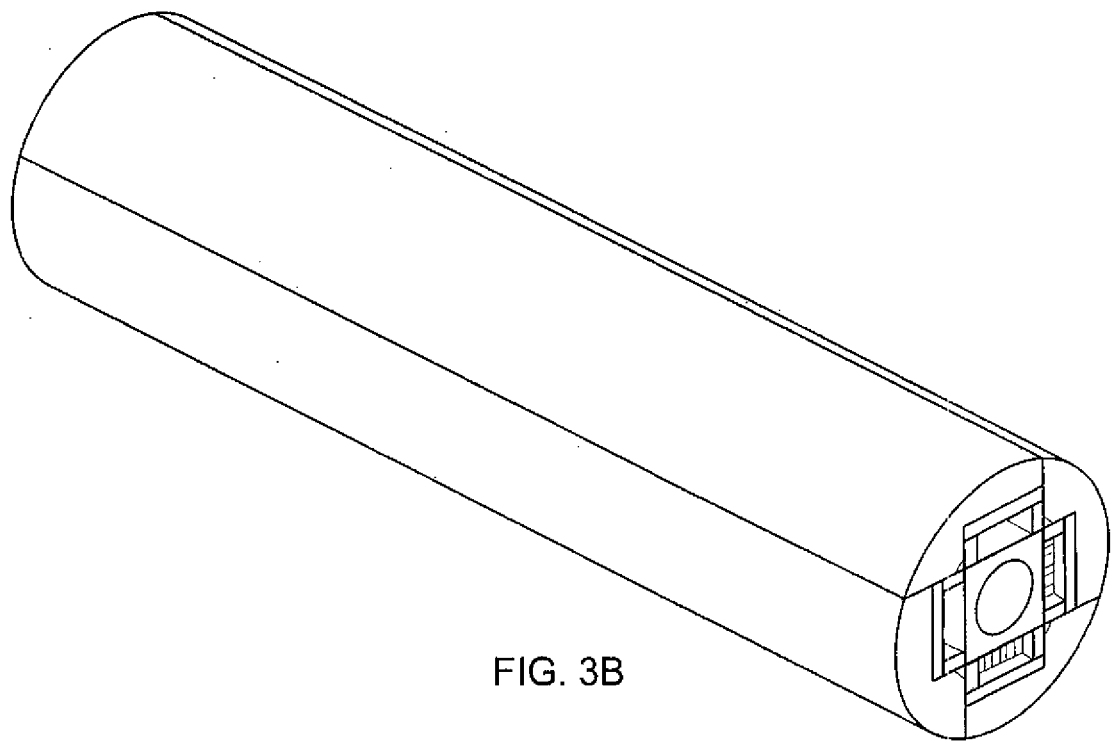
FIG. 3B is a perspective view looking into the front end of a connected diode pumped solid state laser assembly according to the present invention located within the spindle environment.

Electrical cross connections between diode segments (not shown) are accomplished within both end cap regions. Turning now to FIG. 3A, there is shown a cross sectional view of the diode pumped solid-state laser according to the present invention. Of particular interest is the linear segment 5 concept allowing for mounting of the pump laser diode arrays 6. The linear segment 5 concept supports the gain medium 7 over its entire length using eight Teflon cushions 8 which eliminate stress points, and an overhead member 35 with each array 6. The end caps 2 and 3 may include a compliant compression mechanism or ferrule at one or both ends of the rod 7 to prevent axial movement. In this manner, the rod can be retained at both ends.

Due to the extreme shock and vibration experienced by the laser system, an advanced medium is here used for the active gain medium rod. In particular, and as can be appreciated by those skilled in the art, most conventional laser systems employ a single crystalline laser rod. For this high stress, high vibration system however, it is preferred that a polycrystalline (ceramic) laser rod be employed to thereby provide additional strength. Of further advantage, such materials generally offer higher laser efficiencies by increasing the ND doping concentration.

The use of a sintered ceramic rod allows further flexibility as a passive support glass 9 can be added over the active gain region 7. In this manner the shape of the gain medium can be adapted to form a square. This square is the basis for the monolithic structure.

The monolithic concept will allow for no dark sections or shadowed sections of the gain medium, which also provides for application of future gain medium.

Those skilled in the art will recognize that conventional laser pumping applications of laser diode emitters which comprise the diode array segments have their output energy limited to maintain acceptable output. Thermal effects may cause changes to the output wavelength of diode emitters to a point that a diode driven device is not operational. In such circumstances, the diode temperature increases as the device is switched on.

A further aspect of the present invention is that the diode array is balanced along the length of the rod to sufficiently manage the output wavelength of the diodes within the required input wavelength of the active medium over an extended electrical pulse and temperature range, i.e., −50 C to +50 C without the need for ancillary components for temperature control.

Additionally, the voltage drop across the diode array provides information about the health of the pump diodes. When diodes fail, they fail in a shorted condition. The difference between the initial electrical resistance and the electrical resistance over the life of the laser can provide qualitative data about the health of the pump diodes.

The resistance of the pump diodes changes with respect to temperature. A laser itself is its own highly accurate thermometer. This feature can provide adaptive energy input to the laser head thereby compensating energy output of the laser to adjust for age and temperature affects.

The monolithic design allows for closer tolerances and is not prone to stack up tolerances or compaction. This allows for the ability to create a hermetically sealed package.

A hermetically sealed package allows for the use of Galden™ as well as other passive thermal conduction fluids which not only reduce the internal bar temperatures, but also act to passively protect the facets of the diodes from atmospheric moisture and contaminants.

Figure 4:
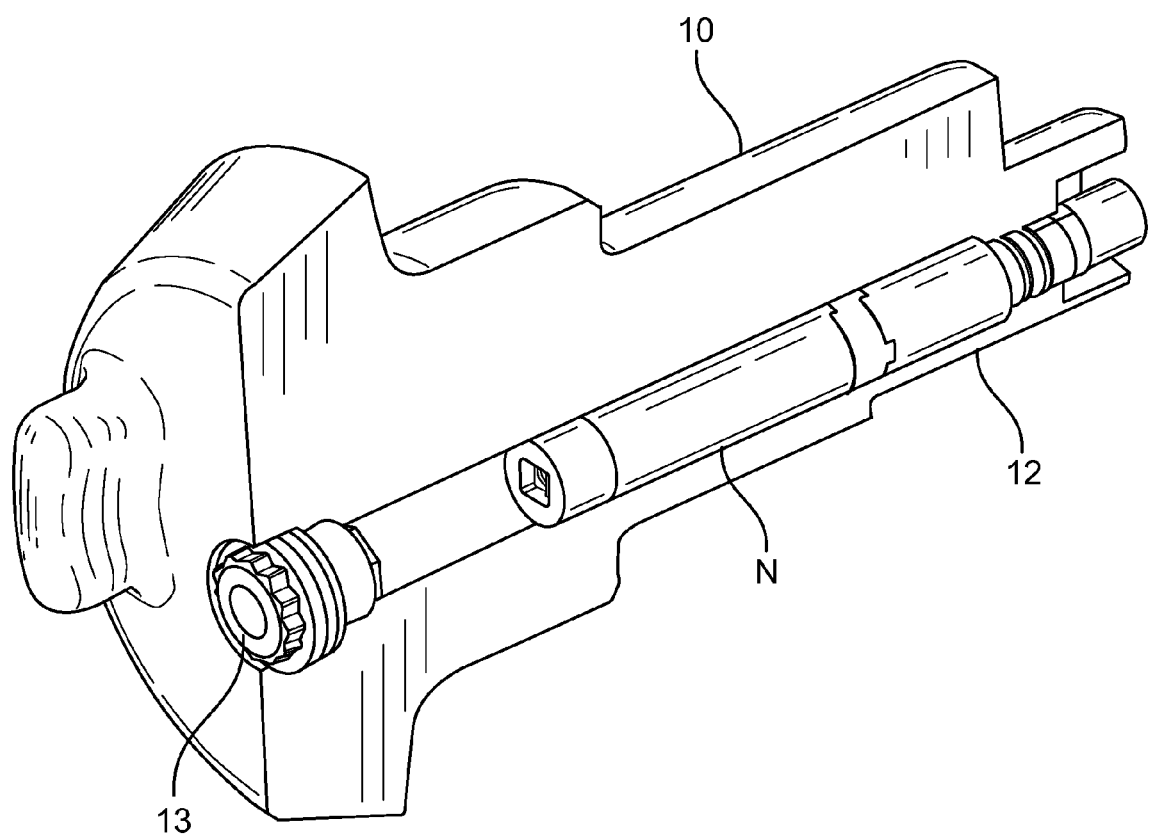
FIG. 4 is a cut-away view of a laser igniter including a diode pumped solid state laser assembly according to the present invention positioned in a large caliber artillery gun breech spindle component.

Finally, FIG. 4 shows a cut away view of a large caliber artillery gun spindle 10 with a laser igniter 11 disposed therein. In addition, shown is the laser to tailstock adapter 12 and the front pressure breech window 13. Operationally, the laser igniter is activated such that it produces laser light which in turn initiates an ignition train of an artillery propellant within the gun.

While the invention may have been described with reference to certain embodiments, numerous changes, alterations and modifications to the described embodiments are possible without departing from the spirit and scope of the invention as defined in the appended claims, and equivalents thereof.

What is claimed is:

1. An extreme environment, hermetically sealed laser assembly for use in firing the ignition train propellant of a 155 mm Howitzer, said laser assembly comprising: an elongated sintered polycrystalline ceramic laser rod, said rod having a defined longitudinal axis, and; a solid transparent passive support glass enclosure for such rod along the full length of such rod, and such glass enclosure having an outer, square shaped rectangular cross-sectional shape, and; at least four robust holding sections tightly enclosing said glass enclosure along the full length thereof, so as to form a unitary holding structure there for, each holding section having a rounded outer surface thereon, and; a tubular laser body member to robustly enclose and hold together such sections therein, said laser body member having a front and a rear end cap means in said laser body member for hermetically closing said laser body member, and for providing outside pin means for electrical connections leading into the respective front and rear extremities of said sections therein, and; each holding section further comprising a cut out area of rectangular cross-sectional shape, running along the full length of said rod, and each said cut out area comprising two elongated polytetrafluoroethylene cushions along the full length of such rod, and resting perpendicularly upon a respective flat surface of said square glass enclosure, and supporting an overhead member in said cut out area, which in turn supports at least six elongated pump diode bars in a stack, said bars uniformly pumping light equally along their entire lengths, into the direction of said rod through a respective glass enclosure flat surface, such pumped light exciting the laser rod such that laser action is produced, and; electrical connections leading from each stack to connection means on its respective segment, which are further electrically connected to said pin means in said front and rear end cap means, said stacks of pump diode bars powerable through said pin means to produce said pumped light, and; wherein laser action output light may be made to exit the said laser body device through an aperture in at least one of said end cap means, and said laser action output light being used to fire the ignition train propellant in said 155 mm Howitzer.

2. The laser assembly of claim 1 further comprising passive thermal conduction fluids within said tubular laser body member to reduce internal pump diode bar temperatures and to passively protect the facets of the pump diode bars from atmospheric moisture and contaminants.

3. The laser assembly of claim 1 wherein said laser rod is a sintered YAG rod.

4. The laser assembly of claim 1 wherein said extreme environment includes: shock, vibration, g-forces, temperature extremes, moisture and/or mud stresses.

* * * * *